United States Patent
Miyake et al.

(10) Patent No.: US 9,686,875 B2
(45) Date of Patent: Jun. 20, 2017

(54) ELECTRICAL DEVICE WITH INCORPORATED CABLE DUCT

(71) Applicant: MITSUBISHI ELECTRIC CORPORATION, Tokyo (JP)

(72) Inventors: Takanori Miyake, Tokyo (JP); Takashi Nakahira, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/908,507

(22) PCT Filed: Aug. 5, 2014

(86) PCT No.: PCT/JP2014/004079
§ 371 (c)(1),
(2) Date: Jan. 28, 2016

(87) PCT Pub. No.: WO2015/025489
PCT Pub. Date: Feb. 26, 2015

(65) Prior Publication Data
US 2016/0212865 A1    Jul. 21, 2016

(30) Foreign Application Priority Data
Aug. 23, 2013   (JP) ................................ 2013-173222

(51) Int. Cl.
*H05K 5/00* (2006.01)
*H05K 5/02* (2006.01)
(Continued)

(52) U.S. Cl.
CPC ........... *H05K 5/0021* (2013.01); *H02B 1/202* (2013.01); *H02G 3/0437* (2013.01); *H05K 5/023* (2013.01);
(Continued)

(58) Field of Classification Search
USPC .................................................. 174/650–669
See application file for complete search history.

(56) References Cited

U.S. PATENT DOCUMENTS 3,166,633 A * 1/1965 Guzan, Jr. ............ H02G 3/0418
                                                      138/92
5,693,908 A * 12/1997 Amberger ................ H02G 3/14
                                                      174/59
(Continued)

FOREIGN PATENT DOCUMENTS

JP      63-146414 U      9/1988
JP       7-22762 A      1/1995
(Continued)

*Primary Examiner* — Xanthia C Cunningham
(74) *Attorney, Agent, or Firm* — Birch, Stewart, Kolasch & Birch, LLP

(57) ABSTRACT

There has conventionally been a problem that a cable duct must be disposed as a separate member apart from a device when cable wiring between devices is carried out, and a fixed space is necessary for disposing the cable duct, and thus the space cannot be effectively used. An electrical device incorporates an electrical unit such as an inverter that is wired to a cable, and a cable duct part that houses a cable wired to another device, and has structure in which, by providing slide structure, the size of cable duct part can be adjusted in accordance with the requirements of cable wiring.

5 Claims, 7 Drawing Sheets (a) When duct is not used (b) When duct is used

(51) Int. Cl.
*H02G 3/04* (2006.01)
*H02B 1/20* (2006.01)
*H05K 7/14* (2006.01)
*H02G 3/10* (2006.01)

(52) U.S. Cl.
CPC ......... *H05K 5/0247* (2013.01); *H05K 7/1471* (2013.01); *H02B 1/205* (2013.01); *H02G 3/105* (2013.01)

(56) References Cited

U.S. PATENT DOCUMENTS

| | | | | |
|---|---|---|---|---|
| 6,288,331 | B1 * | 9/2001 | Wirthwein | H02G 9/04 174/481 |
| 7,586,038 | B2 * | 9/2009 | Kanamaru | H02G 3/083 174/489 |
| RE41,353 | E * | 5/2010 | McGrath | H04Q 1/066 379/327 |
| 8,153,910 | B1 | 4/2012 | Penczak | |
| 9,000,297 | B2 * | 4/2015 | Makino | H05K 5/0208 174/50 |
| 2003/0066673 | A1 * | 4/2003 | Doutaz | H01R 4/4836 174/652 |
| 2009/0078833 | A1 * | 3/2009 | Martin | H02G 3/32 248/65 |
| 2009/0126992 | A1 * | 5/2009 | Horn | F16L 5/08 174/656 |
| 2009/0200057 | A1 * | 8/2009 | Caveney | H02G 3/0418 174/101 |
| 2010/0135630 | A1 * | 6/2010 | Hawkins | G02B 6/4475 385/135 |
| 2011/0030832 | A1 * | 2/2011 | Larson | G02B 6/4441 138/137 |
| 2012/0199375 | A1 * | 8/2012 | Yamamoto | H02G 3/0437 174/68.3 |

FOREIGN PATENT DOCUMENTS

| | | |
|---|---|---|
| JP | 2001-44662 A | 2/2001 |
| JP | 2012-135092 A | 2/2001 |
| JP | 2006-60121 A | 3/2006 |
| JP | 2009-100874 A | 5/2009 |
| JP | 2011-66160 A | 3/2011 |
| JP | 2013-34305 A | 2/2013 |

\* cited by examiner (a) Required dimension C
when cable duct is used
in the prior art (b) Required dimension C
in the present embodiment

ELECTRICAL DEVICE WITH INCORPORATED CABLE DUCT

TECHNICAL FIELD

This invention relates to an electrical device, using cable wiring, with an incorporated cable duct.

BACKGROUND ART

When devices such as an inverter, a circuit breaker, and an electromagnetic switch are combined and used in a control panel or a switchboard etc., power and signals such as control signals are transmitted through cables connecting between the devices. Each of the devices has a terminal for connecting a cable. Signal transmission between the devices is carried out by connecting the cable to the terminals. In this case, in general, for maintenance and from an appearance point of view, a cable duct that houses the cables is provided, and through the cable duct, the cables are transversally laid and passed between the devices. In the following Patent Documents 1 and 2, configurations are disclosed in which devices are connected by cables through cable ducts and a duct cover is mounted on a duct body.

PRIOR ART DOCUMENT

Patent Document

Patent Document 1: Japanese Unexamined Utility Model Publication No. S63-146414

Patent Document 2: Japanese Unexamined Patent Publication No. 2013-34305

SUMMARY OF THE INVENTION

Problems to be Solved by the Invention

However, in the prior art described above, the device and the cable duct are separately produced and separately disposed. Thus, since a fixed space for disposing the cable duct that is a separate member is necessary, there exists a problem in that the space is not effectively used.

The present invention has been made in consideration of the above described problem, and an object thereof is to connect cables between devices while effectively using the space compared to the prior art.

Means for Solving the Problems

In order to achieve the object described above, an electrical device with an incorporated cable duct according to the present invention includes: an electrical unit to which a cable is wired; and a first case member and a second case member that house the electrical unit, wherein the first case member and the second case member constitute a unified case and the second case member includes a duct functional part that houses a cable wired to another device through an opening between the first case member and the second case member.

Effect of the Invention

In an electrical device according to the present invention, devices can be connected using cables while effectively using the space compared to the prior art.

EMBODIMENT FOR CARRYING OUT THE INVENTION

Embodiment 1

Embodiment 1 of the present invention shows a configuration of devices for connecting therebetween using cables while effectively using a space. Examples of the devices include a circuit breaker, an electromagnetic switch, an inverter, and a servo amplifier etc., but other devices may be included.

Figure 1:
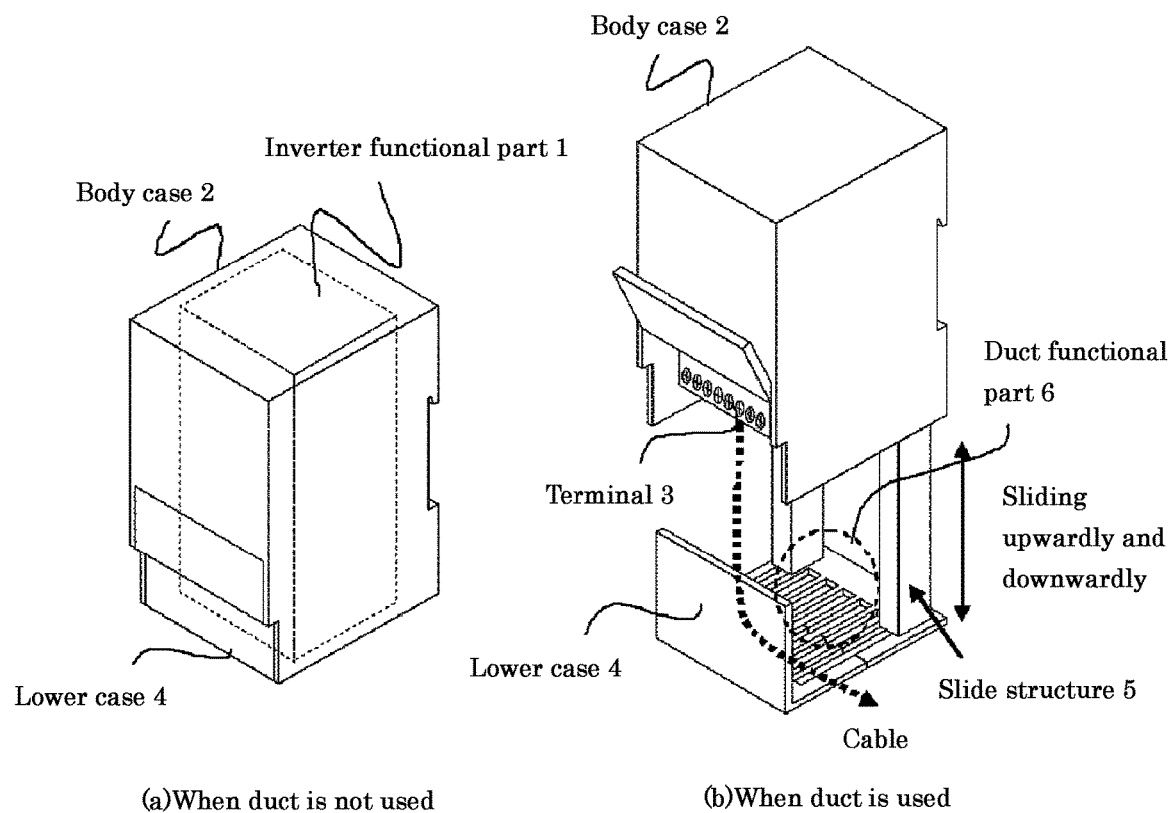
FIG. 1 shows a basic configuration of a device to which Embodiment 1 of the present invention is applied.

Taking an inverter as an example, FIG. 1 shows a basic configuration of a device to which Embodiment 1 of the present invention is applied. FIG. 1(a) shows a situation when a duct is not used and FIG. 1(b) shows a situation when the duct is used. In the figures, Numeral 1 denotes an inverter functional part, Numeral 2 denotes a body case, Numeral 3 denotes a terminal, Numeral 4 denotes a lower case, Numeral 5 denotes slide structure, and Numeral 6 denotes a duct functional part. Note that, in each of the figures, the same numeral indicates the same or a corresponding part.

The inverter functional part 1 is housed in the inside of body case 2, and the body case 2 plays a role as a cover for protecting internal components. In the inside of body case 2, a terminal 3 is provided for transferring power and control signals etc. The lower case 4 includes a lower part of a case that houses the device. The body case 2 and the lower case 4 being in complementary relation therewith constitute the case that houses the inverter functional part 1. The body case 2 is coupled with the lower case 4 through the slide structure 5, and a space between the body case 2 and the lower case 4 can be expanded or closed by means of the slide structure 5.

In the embodiment of present invention, an open space between the body case 2 and the lower case 4 is used as the duct functional part 6 for cable wiring. The duct functional part 6 includes a bottom portion of the lower case 4 as a part of the structure, and in a space region between the body case 2 and the lower case 4, cables are transversally laid and pulled out. With this configuration, a plurality of devices having duct functional parts 6 are coupled, and thus cables can be transversally laid and passed between the plurality of devices.

In FIG. 1, the open space between the body case 2 and the lower case 4 is used as the duct functional part 6. In the configuration, the body case 2 and the lower case 4 are unified by providing the slide structure 5, so that a cable duct as a separate member is not necessary. Thus, an installation work for the cable duct being the separate member is not also necessary. Normally, when a device is installed, positional relation between the body case 2 and the lower case 4 is fixed by means of the slide structure 5 so as for the duct functional part 6 to be set to have an appropriate size. Note that, adjustment of the size of duct functional part 6 may be carried out except when a device is installed.

When cables are not transversally laid and passed between the devices, the open space between the body case 2 and the lower case 4 can be closed by means of the slide structure 5. That is, by means of the slide structure 5, the body case 2 and the lower case 4 can be brought into close contact. Thus, in accordance with a situation of cable wiring, the size of open space between the body case 2 and the lower case 4 is adjustable.

Although a fixed space is necessary for the duct functional part 6 in the prior art, in the embodiment of present invention, the size of duct functional part 6 is adjustable in accordance with a cable usage situation. When cables are not used, the open space used as the duct functional part 6 can be made smaller, so that the space can be effectively used. In addition, a device and the duct functional part 6 are unified, so that a configuration that does not require the cable duct as the separate member can be realized. As a result, purchase of the cable duct as the separate member is not necessary, and thereby reducing the cost. Further, since the cable duct is incorporated into the device in the embodiment of present invention, the device alone can deal with cable wiring.

As described above, the electrical device with the incorporated cable duct in the present embodiment includes an electrical unit such as the inverter functional part 6 to which a cable is wired, and the body case 2 and the lower case 4 that house the electrical unit. The body case 2 and the lower case 4 constitute a unified case. The lower case 4 includes the duct functional part that houses a cable wired to another device through an opening between the body case 2 and the lower case 4. With the configuration described above, devices can be connected therebetween using cables while the space can be effectively used, compared to the prior art. Further, the body case 2 that houses the electrical unit such as the inverter functional part 6, and the lower case 4 that is coupled with the body case 2 through the slide structure 5, are provided, and the space between the body case 2 and the lower case 4 is used as the cable duct part. With the configuration described above, in accordance with the cable usage situation, the space can be effectively used. In addition, the body case 2 and the lower case 4 can be brought into close contact by means of the slide structure 5. With the structure described above, the space required for the cable duct part can be made smaller when cables are not used.

Figure 2:
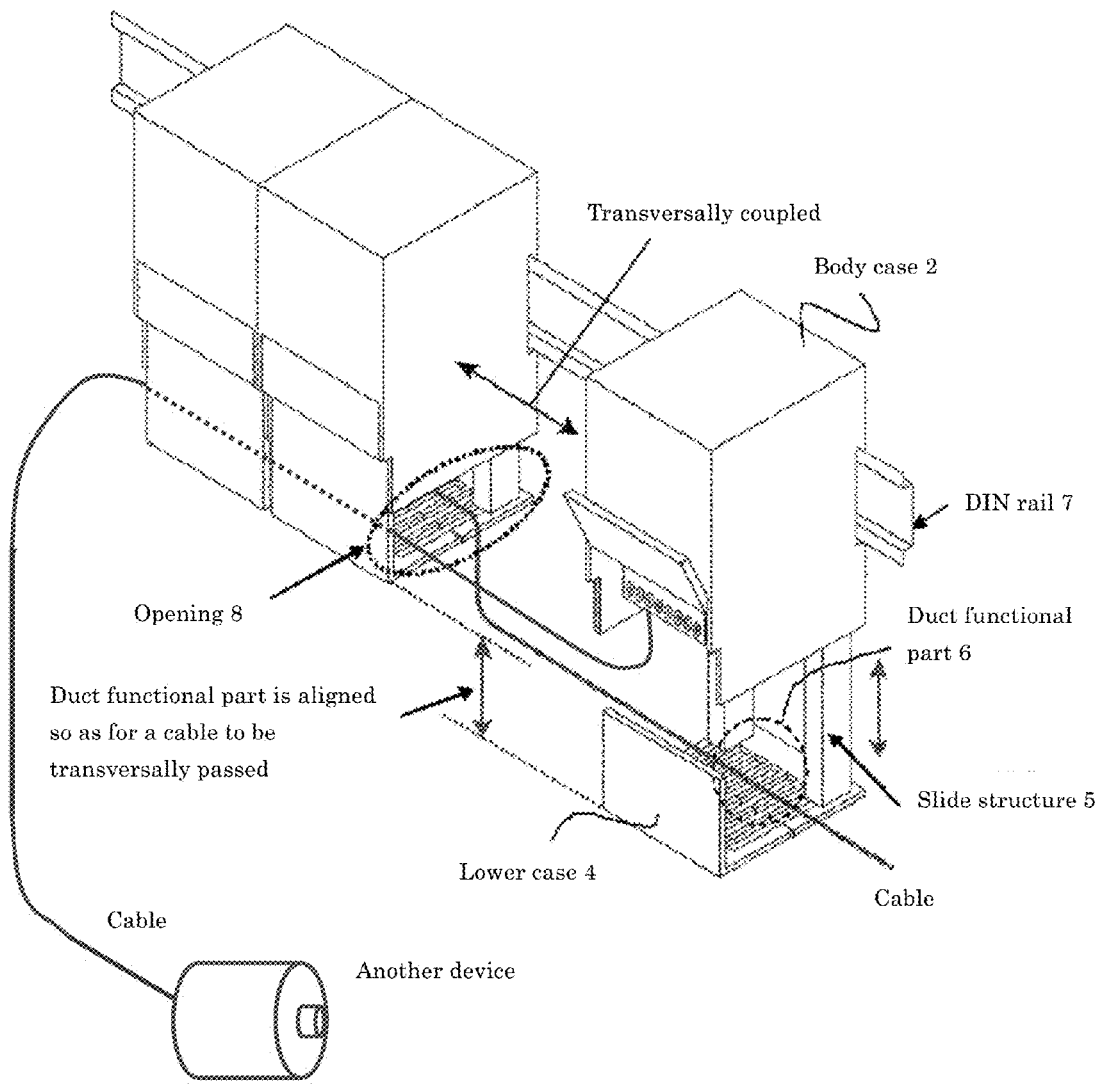
FIG. 2 shows a configuration in which a plurality of devices are coupled according to Embodiment 1 of the present invention.

FIG. 2 shows a configuration in which the plurality of devices including duct functional parts 6 are coupled using a DIN (Deutshes Institut fur Normung) rail 7. In the figure, Numeral 7 denotes the DIN rail, and Numeral 8 denotes the opening through which cables are transversally laid and passed.

As shown in the figure, the plurality of devices including duct functional parts 6 are transversally coupled on the DIN rail 7, so that a position of each device is aligned. Further, by adjusting a position of the duct functional part 6 in each device by means of the slide structure 5, a vertical position of the duct functional part 6 in each device is aligned so as for a cable to be transversally passed. The vertical position of duct functional part 6 in each device is adjusted in accordance with a volume of cables housed and an installation situation of peripheral devices. It is more preferable that the size of duct functional part 6 is adjusted to be as small as possible. In addition, the lower case 4 is coupled, through the slide structure 5, to the body case 2 that houses the device.

Figure 3:
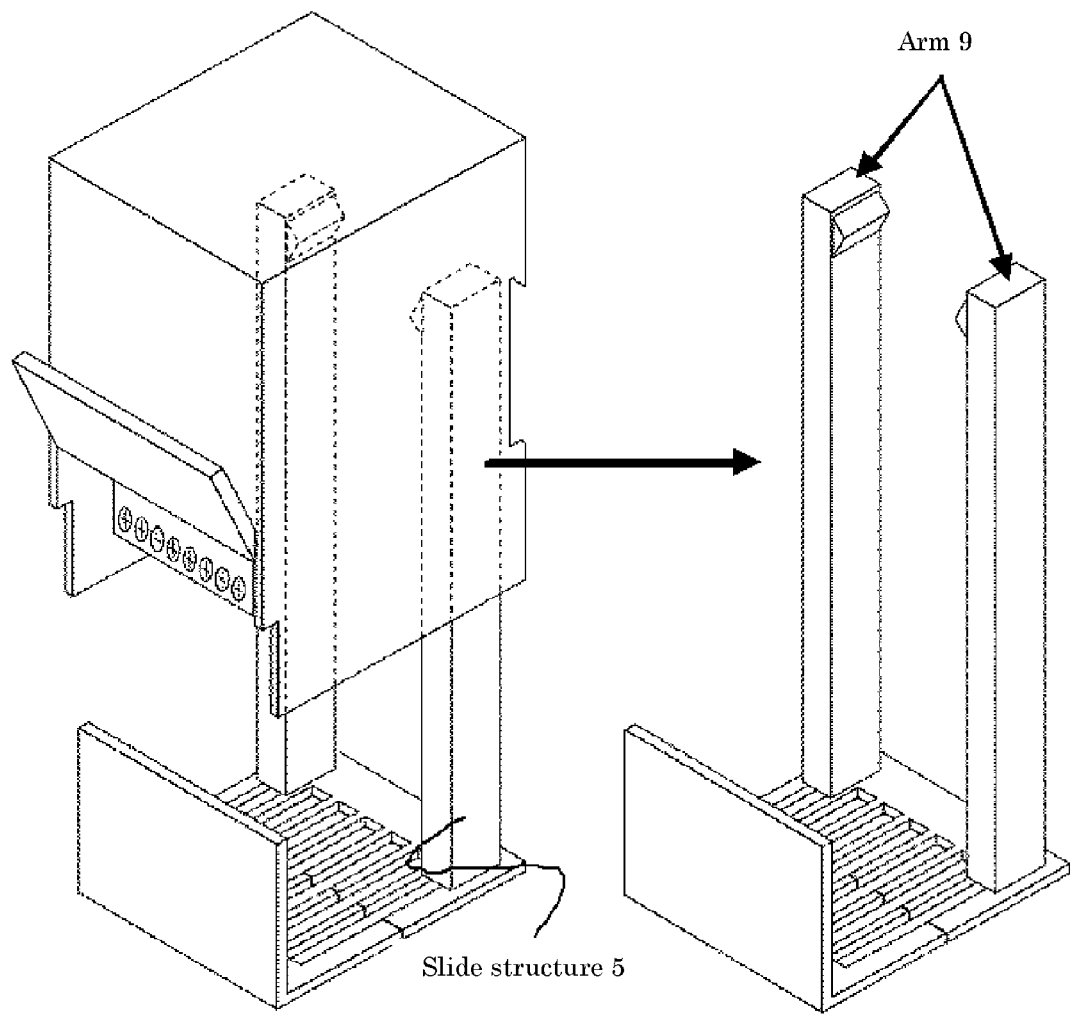
FIG. 3 shows a configuration of slide structure provided in a device to which Embodiment 1 of the present invention is applied.

FIG. 3 shows a configuration of the slide structure 5 provided in the device. In the figure, Numeral 9 denotes an arm. As shown in the figure, the lower case 4 is coupled to the body case 2 through the slide structure 5 including two arms 9.

Figure 4:
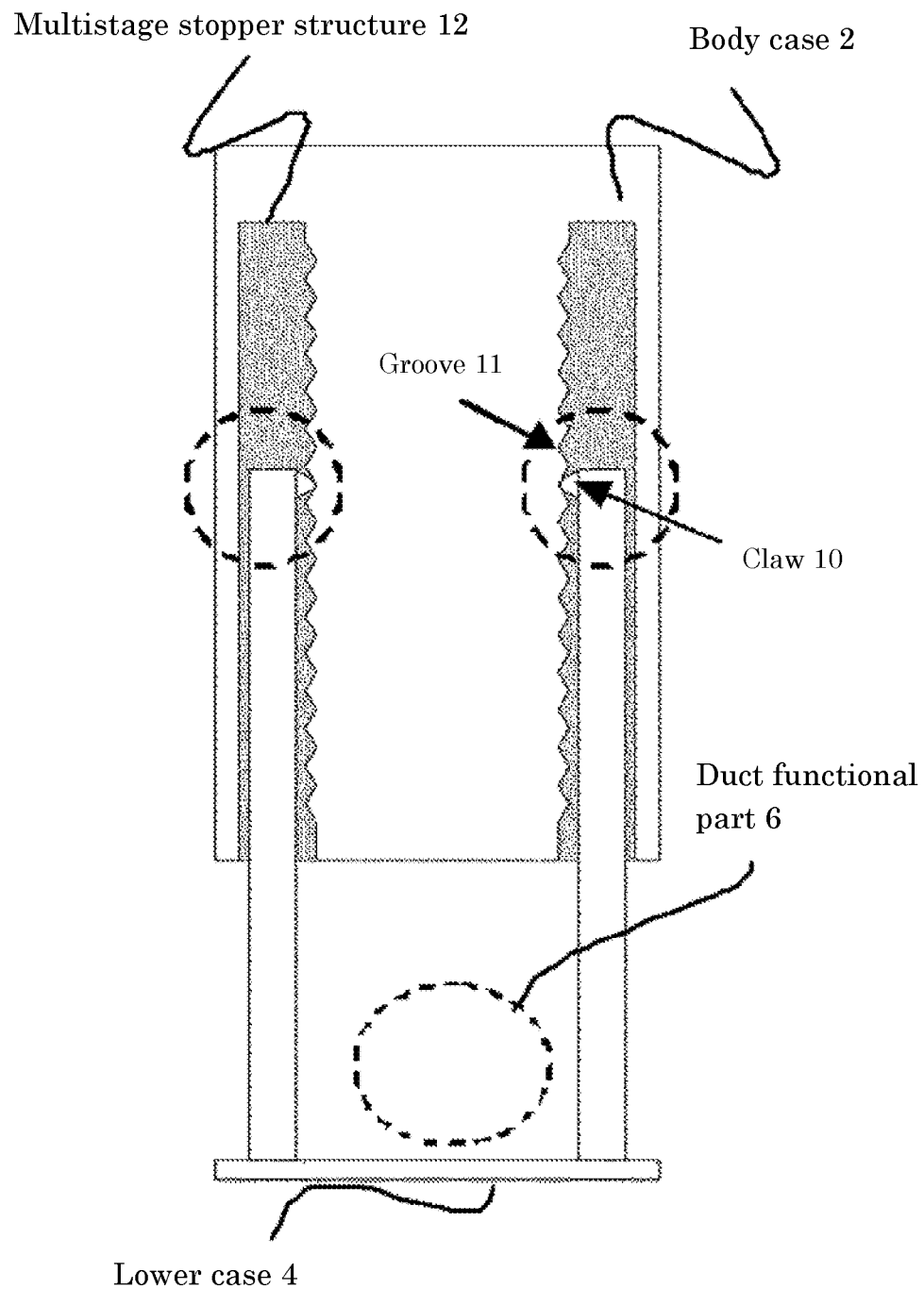
FIG. 4 is a diagram showing detailed slide structure according to Embodiment 1 of the present invention.

FIG. 4 shows the slide structure 5 in detail. In the figure, Numeral 10 denotes a claw, Numeral 11 denotes a groove, and Numeral 12 denotes multistage stopper structure. The slide structure 5 includes the multistage stopper structure 12, and as the multistage stopper structure 12, the groove 11 is provided in the body case 2 and the claw 10 is provided in the lower case 4. The claw 10 fits into any one of a plurality of grooves 11, and the claw 10 engages with the groove 11 structurally owing to deflection of the component. When the body case 2 or the lower case 4 are pulled or pushed, a movement arises in the multistage stopper structure 12, and when the hand is released, the claw 10 fits into the groove 11. When the claw 10 fits into the groove 11, a setting position by the slide structure 5 is determined, and thus the size of duct functional part 6 is set.

Figure 5:
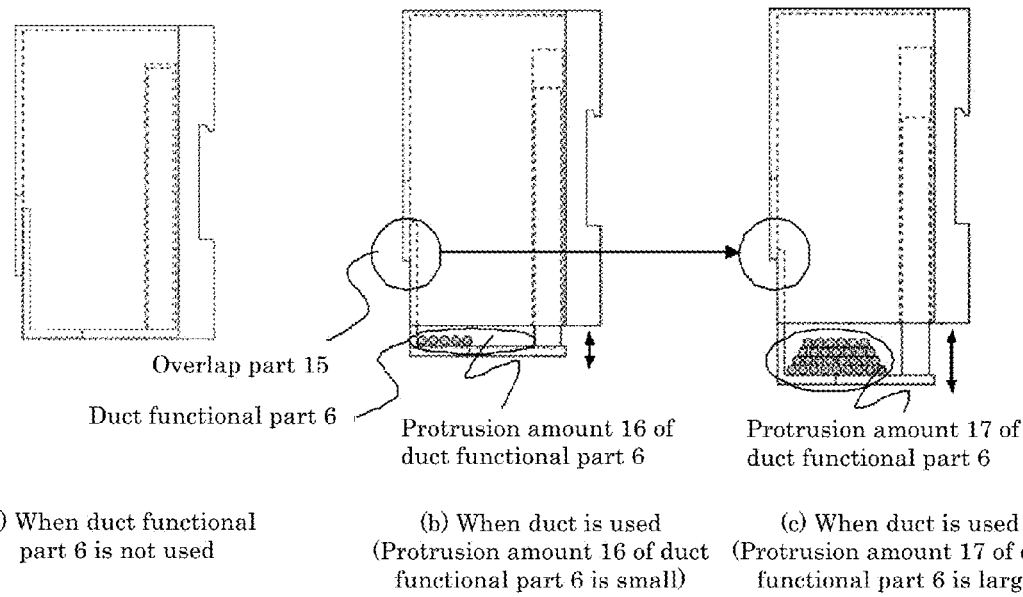
FIG. 5 is a diagram showing variations of setting in the slide structure according to Embodiment 1 of the present invention.

In FIG. 5, variations of setting in the slide structure 5 are shown in accordance with situations. In the figure, Numeral 15 denotes an overlap part, and Numerals 16, 17 each show a protrusion amount of the duct functional part 6. When the duct functional part 6 is not used as shown in FIG. 5(a), the body case 2 and the lower case 4 are set to be brought into close contact by means of the slide structure 5 so as for the duct functional part 6 not to be seen from the outside. In addition, when a small amount of cables is laid in the duct functional part 6 as shown in FIG. 5(b), the body case 2 and the lower case 4 are set so as for the protrusion amount 16 of duct functional part 6 to be small by means of the slide structure 5. Further, when a large amount of cables is laid in the duct functional part 6 as shown in FIG. 5(c), the body case 2 and the lower case 4 are set so as for the protrusion amount 17 of duct functional part 6 to be large by means of the slide structure 5.

The device according to the embodiment of present invention includes overlap structure 15 in order to ensure a good appearance and cable housing ability. The overlap structure 15 corresponds to a portion where the body case 2 and the lower case 4 overlap with each other, and thereby the duct functional part 6 cannot be seen from the outside. By the overlap structure 15, the overlap between the body case 2 and the lower case 4 is ensured even when the size of duct functional part 6 is changed by means of the slide structure 5, so that an unnecessary portion of the duct functional part 6 can be made invisible from the outside.

Figure 6:
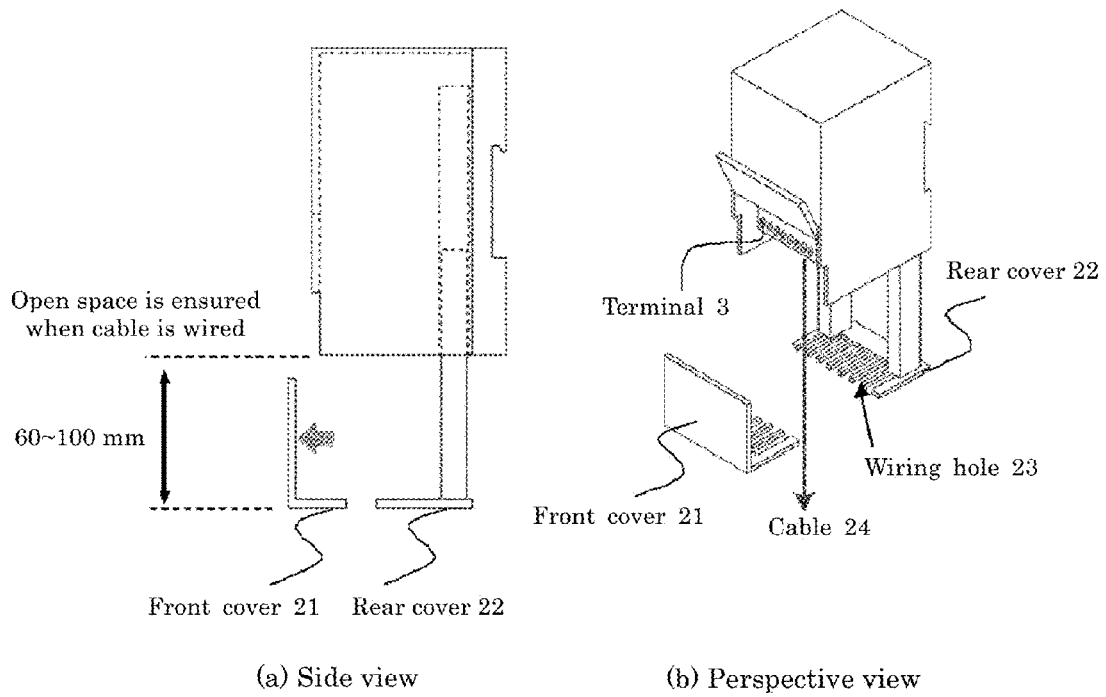
FIG. 6 is a diagram showing structure for a front cover and a rear cover according to Embodiment 1 of the present invention.

FIG. 6 shows structure for a front cover 21 and a rear cover 22 in the lower case 4. In the figure, Numeral 21 denotes the front cover, Numeral 22 denotes the rear cover, Numeral 23 denotes a wiring hole slit, and Numeral 24 denotes a cable. As shown in FIG. 6(a), a configuration is adopted in which the lower case 4 is separated into the front cover 21 and the rear cover 22. With the configuration, the front cover 21 is detached from the rear cover 22 to ensure a large open space during work for cable wiring. In addition, as shown in FIG. 6(b), the large open space between the front cover 21 and the rear cover 22 is ensured, so that the cable 24 connected to the terminal 3 can be drawn downwardly to the outside of the device. Specifically, the front cover 21 is separated from the rear cover 22, and the cable 24 that remains connected is inserted into the wiring hole slit 23 positioned between the front cover 21 and the rear cover 22, and thereby the cable 24 can be drawn downwardly. Thus, the wiring path length of cable 24 can be shortened. In this way, according to the present embodiment, the lower case 4 can be separated into the two covers, i.e., the front cover 21 and the rear cover 22, and when there exists a device to be connected, cables can be smoothly wired by the separation of covers as described above.

Figure 7:
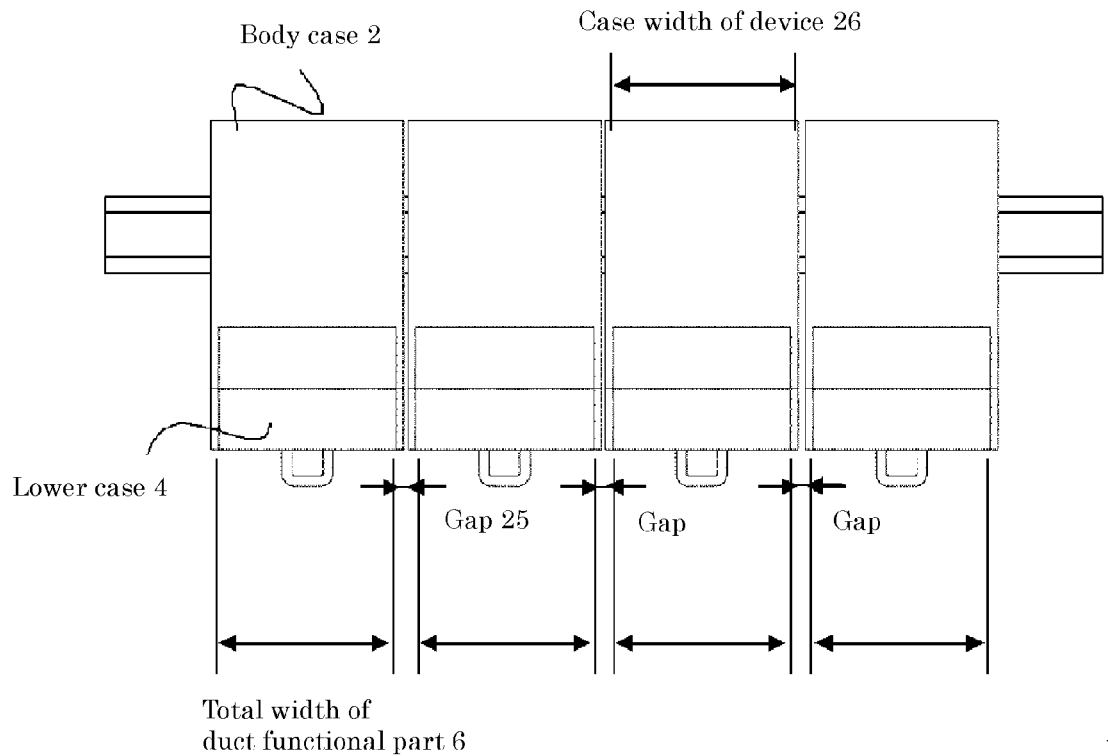
FIG. 7 shows an example of a dimension in a duct functional part according to Embodiment 1 of the present invention.

FIG. 7 shows an example of a dimension in the duct functional part 6. In the figure, Numeral 25 denotes a gap, and Numeral 26 denotes a width of the body case 2 in a device. The width of duct functional part 6 is made to be nearly the same as the case width 26 of a device so as for a cable not to be seen from the gap 25 positioned between the respective duct functional parts 6 in the devices when the devices are coupled. When a cable is not wired to another device, the lower case 4 and the body case 2 are brought into close contact so as for the duct functional part 6 not to be seen from the outside. Further, when the plurality of devices are coupled, the slide structure is provided by means of which the height of open space between the body case 2 and the lower case 4 is adjusted in a range from 60 to 100 mm so that wiring work for a cable, etc., can be easily carried out at the open space of the duct functional part 6.

Figure 8:
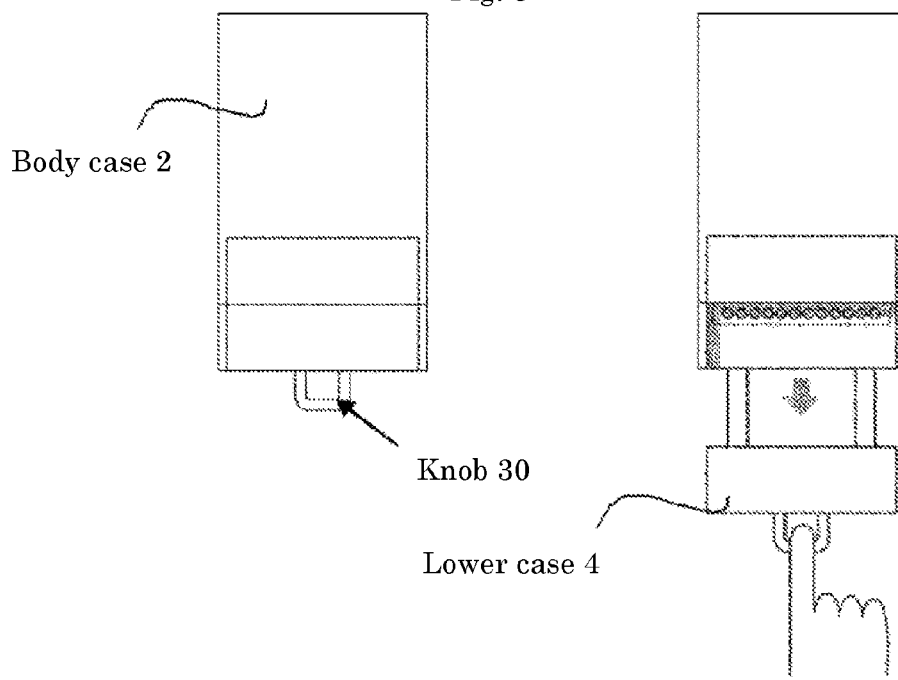
FIG. 8 shows structure of a knob for slide operation for the duct functional part according to Embodiment 1 of the present invention.

FIG. 8 shows structure of a knob 30 for slide operation for the duct functional part 6. In the figure, Numeral 30 denotes the knob. As shown in the figure, the knob 30 is provided at an under surface of the lower case 4 so as for the slide operation to be easily carried out with one's fingertip. Using the knob 30, the front cover 21 and the rear cover 22 can be easily separated. In this way, the device according to the present embodiment includes the knob 30 for carrying out the slide operation of lower case 4 with one's fingertip. With the structure described above, the front cover 21 and the rear cover 22 can be easily separated.

Figure 9:
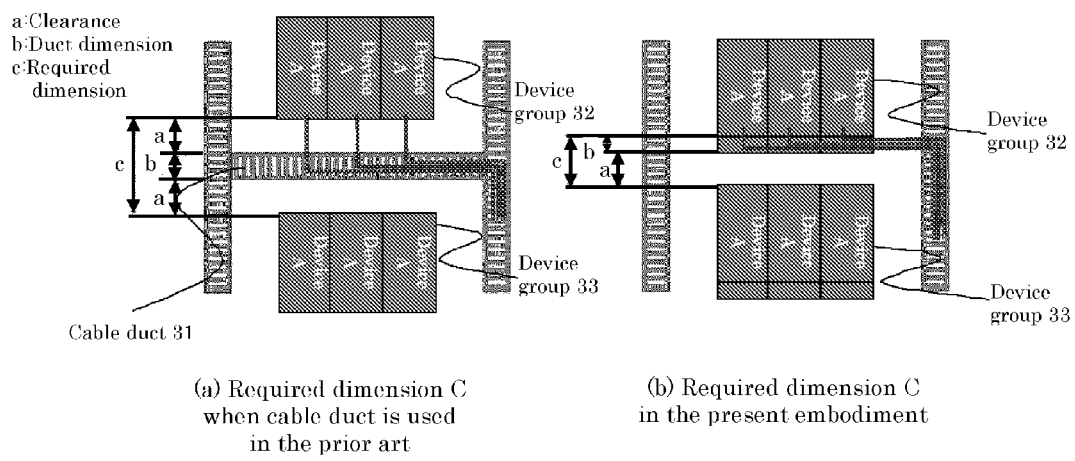
FIG. 9 is a diagram showing a state of cable wiring between devices according to Embodiment 1 of the present invention.

FIG. 9 shows states of cable wiring between devices in cases where devices according to the embodiment of present invention and devices according to the prior art are used. In the figure, Numeral 31 denotes a cable duct, and Numerals 32, 33 each denote a device group. In the prior art as shown in FIG. 9(a), the separate member of cable duct 31 is necessary when cable wiring between the devices is carried out. In contrast, in the embodiment of present invention as shown in FIG. 9(b), since the duct functional part 6 is incorporated into each of the devices, the separate member of cable duct is not necessary when cable wiring between the devices is carried out. Therefore, compared to the prior art, the space can be effectively used in the embodiment of present invention, so that the distance "c" between the device group 32 and the device group 33 is shortened, compared to the prior art.

According to the configuration described above, the body case 2 and the lower case 4 are unified by providing the slide structure 5, so that the cable duct as the separate member is not necessary. In addition, since the size of duct functional part 6 is adjustable in accordance with a situation of cable wiring, the space can be effectively used when cables are wired.

Although Numeral 4 denotes the lower case in the present embodiment, Numeral 4 may not necessarily be positioned in the lower part, but it may be positioned in a side part when the device is laid horizontally. In addition, the body case 2 and the lower case 4 may be called as a first case member and a second case member, respectively. The open space between the body case 2 and the lower case 4 may be called as a space between the body case 2 and the lower case 4. Further, the duct functional part 6 may be called as a cable duct part, and the device may be called as an electrical device.

EXPLANATION OF REFERENCE CHARACTERS

1: inverter functional part 2: body case 3: terminal 4: lower case 5: slide structure 6: duct functional part 7: DIN rail 8: opening 9: arm 10: claw 11: groove 12: multistage stopper structure 15: overlap part 16, 17: protrusion amount of duct functional part 6 21: front cover 22: rear cover 23: wiring hole slit 24: cable 25: gap 26: case width of device 30: knob 31: cable duct 32, 33: group of devices.

The invention claimed is:

1. An electrical device with an incorporated cable duct comprising:
    an electrical unit to which a cable is wired;
    a first case member and a second case member that house the electrical unit; and
    a slide structure which couples the second case member to the first case member and provides an opening between the first and second case members, wherein
    the first case member and the second case member constitute a unified case;
    the second case member includes a duct functional part that houses a cable wired to another device through the opening between the first case member and the second case member; and
    the slide structure enables a size of the duct functional part to be adjustable in a longitudinal direction.

2. The electrical device with an incorporated cable duct according to claim 1, wherein the slide structure enables the first case member and the second case member to be brought into close contact when the cable is not wired.

3. The electrical device with an incorporated cable duct according to claim 1, wherein the second case member can be separated into two covers.

4. The electrical device with an incorporated cable duct according to claim 1, wherein the second case member includes a hole in the longitudinal direction.

5. The electrical device with an incorporated cable duct according to claim 1, wherein the second case member includes a knob for carrying out slide operation with one's fingertip.

* * * * *